(12) United States Patent
Seo

(10) Patent No.: US 7,153,748 B2
(45) Date of Patent: Dec. 26, 2006

(54) SEMICONDUCTOR DEVICES AND METHODS FOR FABRICATING THE SAME

(75) Inventor: Young-Hun Seo, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 64 days.

(21) Appl. No.: 11/027,539

(22) Filed: Dec. 30, 2004

(65) Prior Publication Data
US 2005/0139933 A1   Jun. 30, 2005

(30) Foreign Application Priority Data
Dec. 31, 2003   (KR)   ........................ 10-2003-0101895

(51) Int. Cl.
*H01L 21/336* (2006.01)
(52) U.S. Cl. ................ 438/300; 438/595; 257/E21.432
(58) Field of Classification Search ................ 438/233, 438/300, 595; 257/E21.432
See application file for complete search history.

(56) References Cited

U.S. PATENT DOCUMENTS

| 5,319,232 | A | | 6/1994 | Pfiester | |
|---|---|---|---|---|---|
| 5,683,924 | A | * | 11/1997 | Chan et al. | 438/300 |
| 6,265,272 | B1 | * | 7/2001 | Chen | 438/300 |
| 6,335,251 | B1 | | 1/2002 | Miyano et al. | |
| 6,429,084 | B1 | * | 8/2002 | Park et al. | 438/305 |

* cited by examiner

*Primary Examiner*—Chandra Chaudhari
(74) *Attorney, Agent, or Firm*—Andrew D. Fortney

(57) ABSTRACT

Semiconductor devices having an elevated contact region and methods of fabricating the same are disclosed. A disclosed semiconductor device includes a semiconductor substrate, a gate on the semiconductor substrate, spacers on sidewalls of the gate, an epitaxial layer on the semiconductor substrate, source/drain regions within the semiconductor substrate below the epitaxial layer, and low doping concentration regions within the semiconductor below the spacers. In an example, the spacers partially overlap onto the epitaxial layer.

6 Claims, 5 Drawing Sheets

SEMICONDUCTOR DEVICES AND METHODS FOR FABRICATING THE SAME

FIELD OF THE DISCLOSURE

The present disclosure relates generally to semiconductor device fabrication and, more particularly, to semiconductor devices having an elevated contact region and methods of fabricating the same.

BACKGROUND

Recently, as semiconductor devices have become highly integrated, the channel distance between the source and the drain of a semiconductor device has becomes increasingly shortened. As the channel distance has shortened, the electric potential across the channel from the source region to the drain region has increased such that a strong horizontal electric field is generated between the source and drain regions, whereby the threshold voltage of the channel area is destabilized. This electric field causes a punchthrough phenomenon which degrades the characteristics of the semiconductor device. This punchthrough phenomenon is called the "short channel effect."

Various techniques have been proposed to solve these problems. These proposed techniques include: reducing the thickness of the pad oxide layer, increasing the impurity concentration of the channel region, forming the source/drain regions shallow, or forming the device on a silicon-on-insulator (SOI) substrate. Among these approaches, the techniques of reducing the thickness of the pad oxide layer and/or increasing the impurity concentration of the channel region have shortcomings in that they are sensitive to process variations and are difficult to control accurately.

In order to solve these issues, an elevated contact technique for forming the source/drain regions on an epitaxial layer has been proposed. (The epitaxial layer is formed on the surface of the substrate through a self-align technique.) FIG. 1A to FIG. 1D are cross-sectional views illustrating a conventional process for fabricating a semiconductor device having an elevated contact structure.

Referring to FIG. 1A, a device isolation region 12 is formed in a predetermined area of a semiconductor substrate 10. A pad oxide layer 14 and a gate 16 are sequentially formed on the semiconductor substrate 10.

Referring to FIG. 1B, low concentration doping regions 18 are formed in predetermined areas of the substrate 10 by doping conductive impurity ions into the desired areas. Spacers 20 are formed on the sidewalls of the gate 16.

Referring to FIG. 1C, an epitaxial layer 22 is selectively developed on the semiconductor substrate 10. In the illustrated example, the epitaxial layer 22 is developed to a predetermined height on opposite sides of the gate 16. The epitaxial layer 22 is only formed on the surface of the silicon layer. It is not formed on the dielectric layers of the spacers 20 and/or the device isolation regions 12.

Referring to FIG. 1D, the source and drain regions 24 are formed by doping and diffusing the conductive impurity ions in predetermined regions of the substrate 10 and the epitaxial regions 22.

In a semiconductor device having an elevated contact formed via the above described technique, the epitaxial layer 22 is selectively developed in predetermined areas of the semiconductor substrate 10. In particular, the epitaxial layer 22 is developed at contact area(s) between the spacers 20 and the device isolation areas 12 at relatively slow speed such that the thickness is less in these slow developing areas than in other regions. Each of these areas of reduced thickness is called a facet (F).

However, if the impurity ions for forming the source and the drain are injected into the epitaxial layer 22 having the facet structure, the injection depth is shallow. As a result, the impurities can diffuse to the low concentration doping region(s) at the facet area(s) F which have relatively shallow thickness. This diffusion can degrade the reliability of the resulting semiconductor device.

Figure 1A:
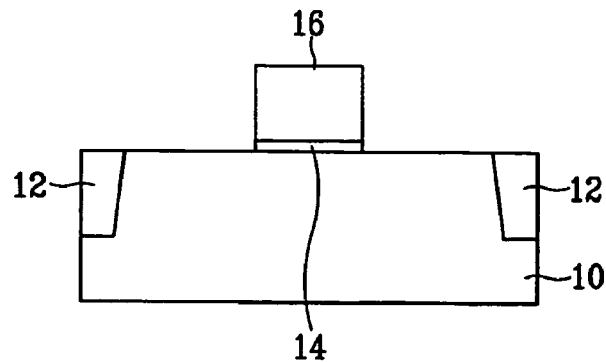
FIG. 1A to FIG. 1D are cross-sectional views illustrating a conventional process for fabricating a semiconductor device having an elevated contact structure.
Figure 1B:
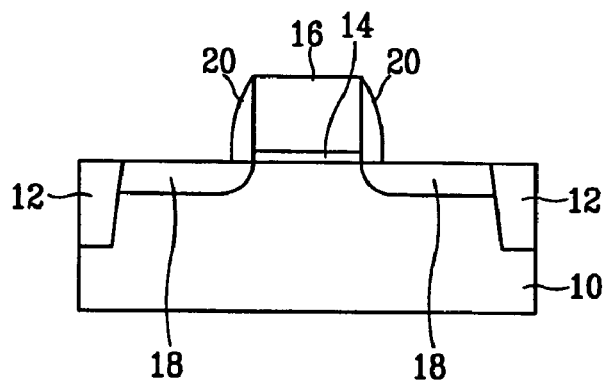
Figure 1C:
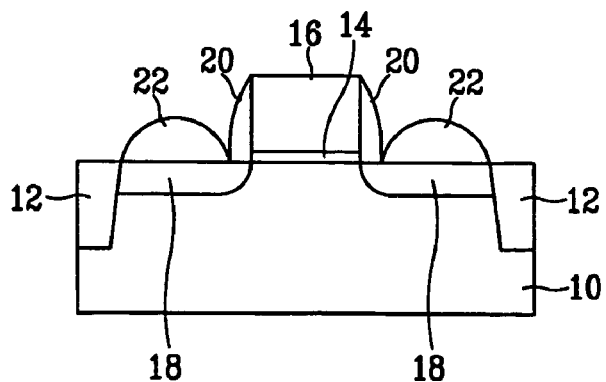
Figure 1D:
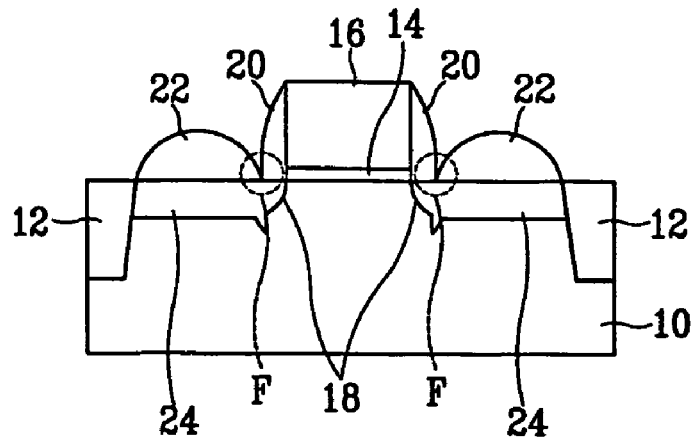

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 2:
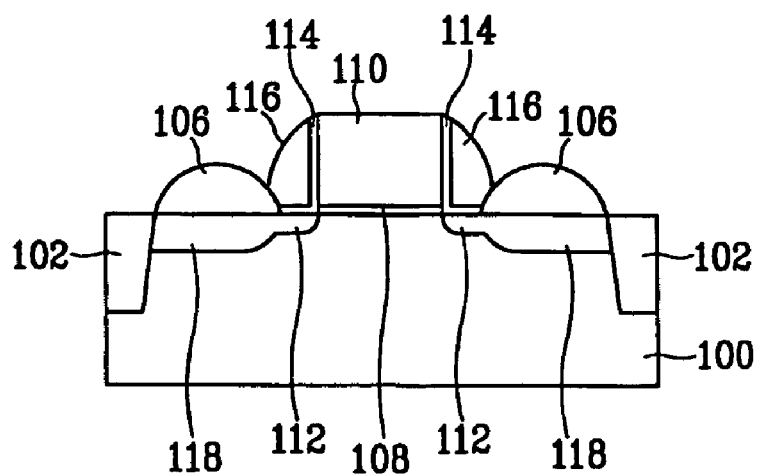
FIG. 2 is a cross sectional view illustrating the structure of a first example semiconductor device constructed in accordance with the teachings of the present invention.

FIG. 2 is a cross sectional view illustrating the structure of a first example semiconductor device constructed in accordance with the teachings of the present invention. Referring to FIG. 2, a plurality of active regions is defined in a semiconductor substrate 100 by device isolation regions 102. Each active region is provided with a well (not shown).

A low doping concentration region 112 is formed in each well by doping conductive impurities at a low concentration. The low doping concentration region 112 defines a channel region as the intrinsic semiconductor region. Ions are doped at the channel region for controlling the threshold voltage of the transistor.

A gate 110 is formed above the channel region. A pad oxide layer 108 is formed between the gate 110 and the semiconductor substrate 100. Spacers 116 are formed on opposite sidewalls of the gate 110. The spacers 116 partially overlapped with respective ones of the low doping concentration regions 112. L-shaped buffer oxide layers 114 are formed between the spacer 116s and the gate 110, and between the spacer 116 and the substrate 100. The buffer oxide layers 114 reduce stress between the gate 110 and the spacers 116.

An epitaxial layer 106 is formed on the substrate 100 in areas where the gate 100 is not formed. These areas are formed into source/drain regions 118 by doping conductive impurity ions at high concentration. In particular, the conductive impurity ions are doped below the epitaxial layer 106 and within the substrate 100 at a high concentration to form the source/drain regions 118 contacting the low doping concentration regions 112.

Each epitaxial layer 106 is formed to have a semicircle shape and to partially overlap with a respective spacer 116. Thus, in the first example device, the spacers 116 overlap with the epitaxial layers 106 and no facet occurs between the spacers 116 and their respective epitaxial layers.

Figure 3A:
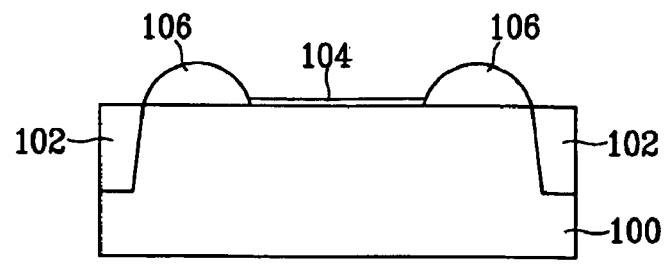
FIG. 3A to FIG. 3C are cross-sectional views illustrating an example method for fabricating the example semiconductor device of FIG. 2.

A method for fabricating the example semiconductor device of FIG. 2 will now be described with reference to FIGS. 3A to 3C. Referring to FIG. 3A, an active region is defined by forming device isolation regions 102 within the semiconductor substrate 100 using a LOCOS or STI technique. Preferably, an STI technique is used.

After defining the active region, a sacrificial oxide layer is formed on the semiconductor substrate 100 by thermally oxidizing the substrate 100. The sacrificial oxide layer is patterned through a photolithograph etching process using a photoresist mask to form an oxide pattern 104. The oxide pattern 104 defines the epitaxial layer to be formed in the following process.

After forming the oxide pattern 104, the epitaxial layer(s) 106 are developed on the semiconductor substrate 110 using the oxide pattern 104 as a mask. The epitaxial layer(s) are selectively formed on the semiconductor substrate 100. The substrate 100 is made of silicon.

Figure 3B:
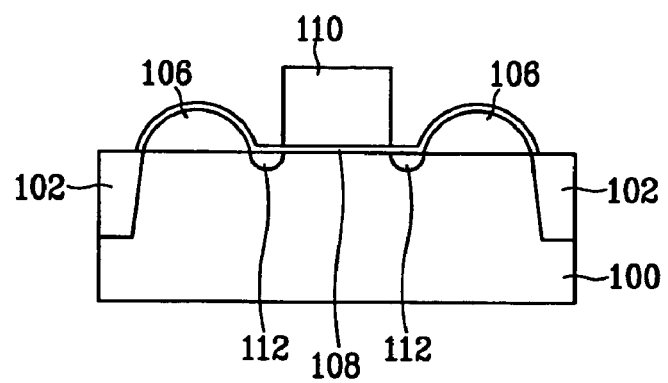

Referring to FIG. 3B, the oxide pattern 104 is removed. Then, a pad oxide layer 108 is formed by thermally treating the substrate 100. Sequentially, a polycrystalline silicon layer is formed on the pad oxide layer 108.

Next, a photoresist is formed on the polycrystalline silicon layer. Then the photoresist is patterned to form a photoresist pattern. The polycrystalline silicon layer is etched using the photoresist pattern as a mask to form the gate 110.

After forming the gate 110, the low doping concentration regions 112 are formed by doping conductive impurity ions into predetermined regions of the substrate 100 at low concentration. In the illustrated example, the P-type conductive impurity ions are boron (B) and gallium (Ga), and the N-type conductive impurity ions are phosphor (P) and arsenic (As).

Figure 3C:
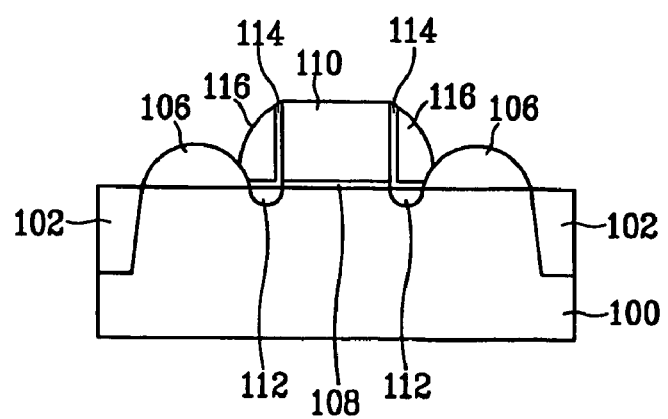

Referring to FIG. 3C, after forming the low doping concentration regions 12, an oxide layer is formed by oxidizing the substrate 100. A nitride layer is deposited on the oxide layer using a chemical vapor deposition technique. The nitride layer and the oxide layer are then globally etched without using a mask to form the spacers 116 and the buffer oxide layers 114 on the sides of the gate 110.

As described above, the spacer 116 is preferably formed after the epitaxial layer 106 is formed such that the spacers 116 overlap with the epitaxial layer 106, thereby avoiding generation of a facet between the spacers 116 and the epitaxial layer 106.

While etching the spacers 116, the degree of overlapping can be controlled by adjusting the width of the spacers 116 to be formed. Consequently, it is possible to form the contact portion(s) of the spacer(s) 116 and the epitaxial layer 106 to have a thickness similar to the thickness of the epitaxial layer 106.

In the example of FIG. 2, the epitaxial layer 106 is doped with conductive impurity ions at a high concentration. The impurity ions are then diffused to the low doping concentration regions 112 using the thermal treatment process to form the source/drain regions 18.

In the example of FIG. 2, since the spacers 116 and the epitaxial layer 106 overlap to thereby avoid generation of facet(s), it is possible to form the source/drain regions 18 to have a uniform depth.

Figure 4:
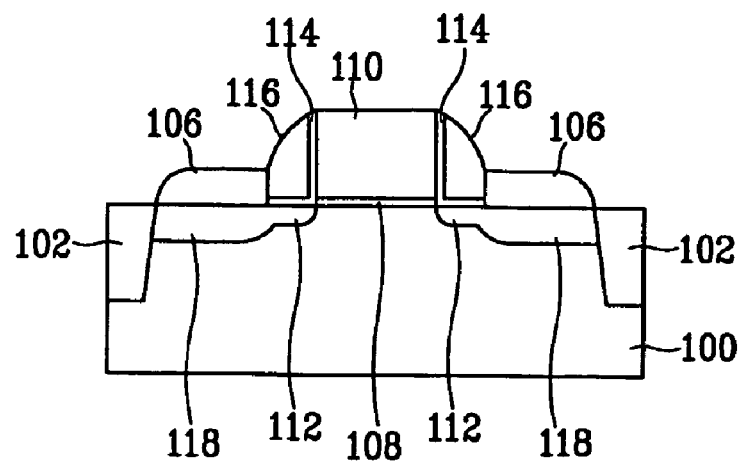
FIG. 4 is a cross sectional view illustrating the structure of a second example semiconductor device constructed in accordance with the teachings of the present invention.

FIG. 4 is a cross sectional view illustrating the structure of a second example semiconductor device constructed in accordance with the teachings of the present invention. The structure of the second example semiconductor device is similar to the structure of the first example semiconductor device. However, the profile of the epitaxial layer 106 of the second example device differs from the profile of the epitaxial layer 106 of the first example device. In particular, in the second example, the contact surface of the spacer 116 and the epitaxial layer 106 is formed in a substantially vertical direction.

Figure 5A:
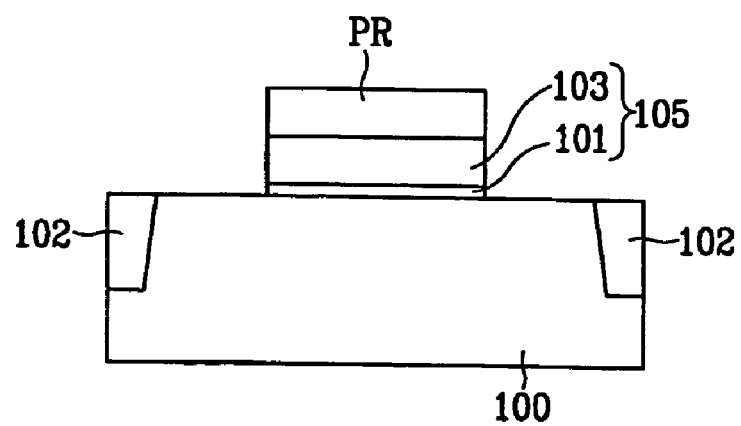
FIG. 5A to FIG. 5D are cross-sectional views illustrating an example process for fabricating the example semiconductor device of FIG. 4.

An example method for fabricating the example semiconductor device of FIG. 4 will now be described with reference to the accompanying drawings in detail. FIG. 5A to FIG. 5D are cross sectional views illustrating the example method. Referring to FIG. 5A, the active region is defined by forming device isolation regions 102 within the semiconductor substrate 100 using a LOCOS or STI technique. Preferably, the STI technique is used.

Next, a sacrificial oxide layer 101 and a sacrificial nitride layer 103 are sequentially formed on the substrate 100. The sacrificial oxide layer 101 and the sacrificial nitride layer 103 define an epitaxial layer to be formed in a following process and are utilized as the sacrificing layer pattern 105 determining the shape of the sidewalls of the epitaxial layer 106. Accordingly, the sacrificial oxide layer 101 and the sacrificial nitride layer 103 are formed such that the sum of their thicknesses is greater than or equal to the thickness of the epitaxial layer 106 to be formed.

Next, a photoresist (PR) pattern is formed on the sacrificial nitride layer 103. A sacrificial layer pattern 105 is then formed by etching the sacrificial nitride layer 103 and the sacrificial oxide layer 101 using the photoresist pattern as a mask.

Figure 5B:
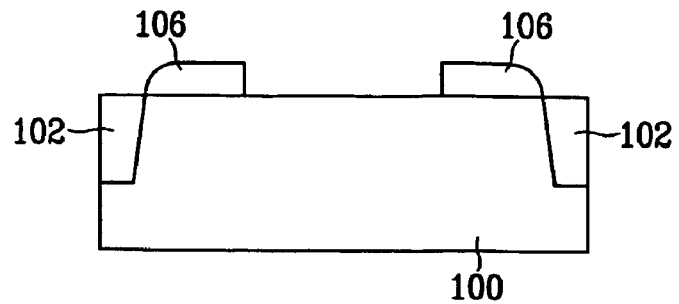

Referring to FIG. 5B, the epitaxial layer 106 is formed on the areas of the substrate 100 which are not covered by the sacrificial layer pattern 105. The epitaxial layer 106 is formed along the sidewall profile of the sacrificial pattern 105. Accordingly, the areas of the epitaxial layer 106 engaging the sidewalls of the sacrificial pattern 105 are formed in a substantially vertical direction corresponding to the sidewall profile of the sacrificial layer pattern 105. However, opposite sides of the epitaxial layer 106 that do not face the sacrificial pattern 105 are formed to have a rounded shape.

Next, the sacrificial layer pattern 105 is removed through a wet or dry etching process.

Figure 5C:
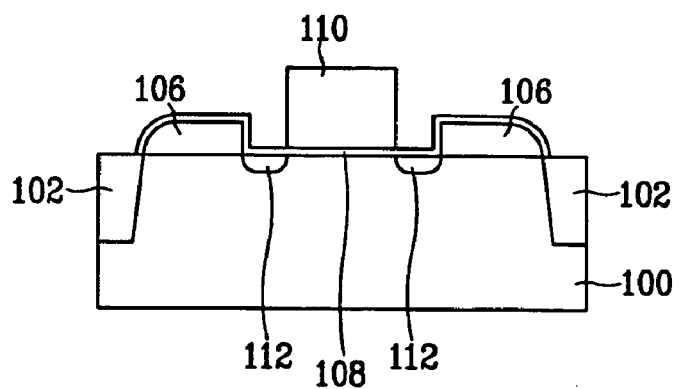

As shown in FIG. 5C, after removing the sacrificial layer pattern 105, a pad oxide layer 108 is formed by thermal oxidizing the substrate. A polycrystalline silicon layer is then deposited on the pad oxide layer 108.

Sequentially, a photoresist pattern is formed on the polycrystalline silicon layer. The polycrystalline silicon layer is then etched using the photoresist pattern as a mask to form a gate 110.

After forming the gate 110, the low doping concentration regions 112 are formed by doping the conductive impurity ions at low concentration in predetermined regions of the semiconductor substrate 100.

Figure 5D:
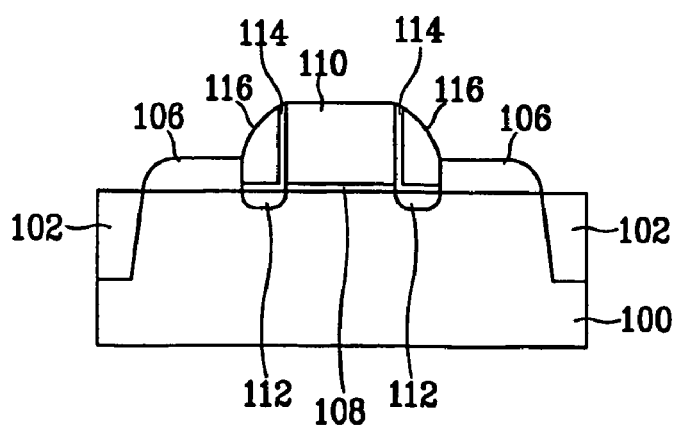

Referring to FIG. 5D, a sidewall oxide layer is formed by oxidizing the silicon substrate. Then a nitride layer is formed on the sidewall oxide layer by depositing silicon nitride through a chemical vapor deposition technique.

The nitride layer and the sidewall oxide layer are etched back without using a mask to form the buffer oxide layers 114 and the spacers 116 on the sidewalls of the gate 110.

As shown in FIG. 4, the epitaxial layer 106 is doped with a high concentration of conductive impurity ions. The impurity ions are then diffused to the low doping concentration regions 112 by a thermal treatment process to form the source/drain regions 118.

In example of FIG. 4, since the epitaxial layer 106 is formed such that the sidewalls facing the gate 110 have a substantially vertical profile and are uniformly developed so as to minimize or avoid facet formation, it is possible to form the ion doping regions 118 at a uniform depth.

As described above, in some example semiconductor fabrication methods, the epitaxial layer 106 is formed on the substrate and above the low doping concentration regions 112. The spacers 116 are then formed at a uniform thickness to partially overlap with the epitaxial layer 106, such that it is possible to avoid the generation of facets, and the source/drain regions 118 can be formed at a uniform doping depth, thereby resulting in improvement in device reliability.

From the foregoing, persons of ordinary skill in the art will readily appreciate that semiconductor devices and methods of fabricating semiconductor devices have been disclosed wherein the formation of facets is minimized or avoided altogether.

In a disclosed example semiconductor device fabrication method, the gate 110 is formed after the epitaxial layer 106 is formed.

A disclosed example semiconductor device includes a semiconductor substrate, a gate formed on the semiconductor substrate, spacers formed on sidewalls of the gate, an epitaxial layer formed on the semiconductor substrate, source/drain regions formed within the semiconductor substrate below the epitaxial layer, and a low doping concentration region formed within the semiconductor substrate below the spacers. The spacers at least partially overlap onto the epitaxial layer.

Preferably, the sidewall of the epitaxial layer facing the spacer has a vertical profile.

A disclosed example method for fabricating a semiconductor device includes: forming a sacrificial layer pattern on a semiconductor substrate, forming an epitaxial layer on the substrate, forming a pad oxide layer on the substrate after removing the sacrificial layer pattern, forming a polycrystalline nitride layer on the pad oxide layer, forming a gate by patterning the polycrystalline nitride layer, forming a pad oxide layer by patterning the pad oxide layer, forming a low doping concentration region by doping a low concentration of conductive impurity ions into a predetermined region of the substrate, forming a buffer oxide layer and spacers on sidewalls of the gate, and forming source/drain regions within predetermined areas of the substrate by doping with a high concentration of conductive impurity ions.

Preferably, the sacrificial layer pattern is formed by depositing an oxide layer and selectively etching the oxide layer.

Preferably, the sacrificial pattern layer is formed by depositing an oxide layer and a nitride layer, and then selectively etching the oxide layer and the nitride layer.

Preferably, the sacrificial layer pattern is formed with sidewalls having a substantially vertical profile at a thickness which is greater than or equal to the thickness of the epitaxial layer.

Preferably, the epitaxial layer is formed after the spacers are formed.

Preferably, the spacers overlap onto the epitaxial layer.

It is noted that this patent claims priority from Korean Patent Application Serial Number 10-2003-0101895, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device, comprising:
   forming a sacrificial layer pattern on a semiconductor substrate;
   forming an epitaxial layer on the substrate;
   forming a pad oxide layer after removing the sacrificial layer pattern;
   forming a polycrystalline nitride layer on the pad oxide layer;
   forming a gate by patterning the polycrystalline nitride layer;
   forming a low doping concentration region by doping a predetermined region of the substrate with a first concentration of conductive impurity ions;
   forming a buffer oxide layer and a spacer on a sidewall of the gate; and
   forming source/drain regions within predetermined areas of the substrate by doping predetermined area of the substrate with a second concentration of conductive impurity ions, the second concentration being higher than the first concentration.

2. A method as defined in claim 1, wherein forming the sacrificial layer pattern comprises forming an oxide layer and selectively etching the oxide layer.

3. A method as defined in claim 1, wherein forming the sacrificial pattern layer comprises forming an oxide layer and a nitride layer, and then selectively etching the oxide layer and the nitride layer.

4. A method as defined in claim 3, wherein the sacrificial layer pattern has a sidewall having a substantially vertical profile, and the sacrificial layer has a thickness which is greater than or equal to a thickness of the epitaxial layer.

5. A method as defined in claim 1, wherein forming the epitaxial layer occurs after forming the spacer.

6. A method as defined in claim 5, wherein the spacer is formed to overlap onto the epitaxial layer.

* * * * *